United States Patent [19]
Griebeler

[11] Patent Number: 5,012,239
[45] Date of Patent: Apr. 30, 1991

[54] HIGH RESOLUTION POSITION SENSOR CIRCUIT

[75] Inventor: Elmer L. Griebeler, Chester Township, Geauga County, Ohio

[73] Assignee: Visa-Trak Corporation, Cleveland, Ohio

[21] Appl. No.: 396,356

[22] Filed: Aug. 21, 1989

[51] Int. Cl.⁵ .............................................. H03M 1/30
[52] U.S. Cl. ........................................ 341/15; 341/11; 341/6; 341/159
[58] Field of Search .................... 341/6, 7, 8, 9, 10, 341/11, 15, 16, 111, 112, 114, 116, 159, 160

[56] References Cited
U.S. PATENT DOCUMENTS 4,630,928 12/1986 Klingler et al. .................. 341/6
4,651,130 3/1987 Pennell ........................... 341/116
4,754,259 6/1988 Joseph et al. .................... 341/116

Primary Examiner—A. D. Pellinen
Assistant Examiner—Howard L. Williams
Attorney, Agent, or Firm—Fay, Sharpe, Beall, Fagan, Minnich & McKee

[57] ABSTRACT

A resolution enhancement circuit comprises a voltage divider used to add multiples of two position representing quadrature signals into a plurality of adder output signals having zero crossings during the cycle of the quadrature signals, a digitizer creating a plurality digital signals based on the individual adder output signals and an output logic circuit combining the digital signals into a new pair of digital quadrature signals of increased resolution. The circuit provides information for more precise control of die casting machines and the like.

13 Claims, 4 Drawing Sheets

HIGH RESOLUTION POSITION SENSOR CIRCUIT

The present invention relates to the art of control devices for position control and more particularly for positioning the piston of a die casting machine or the like.

INCORPORATION BY REFERENCE

U.S. Pat. No. 3,956,973 to Pomplas is incorporated by reference herein as illustrating the art to which the present invention is particularly directed and describing the mechanical aspects of a machine in which the current electronic circuit can be used. As the mechanical aspects of the art and machine are described in detail in the incorporated document and are well known, they will not be again described here.

BACKGROUND OF THE INVENTION

In many mechanical processes, it is important to position and/or move a piston rod or the like axially under precise control. One such application is die casting. In die casting, the introduction of a molten metal charge into a die is controlled by the precise positioning and movement of a piston by means of a rod. As describe in Pomplas U.S. Pat. No. 3,956,973 the movement and positioning of the rod is controlled with a feedback controller. Information on the position and velocity of the rod is obtained by means of sensors fixed in place in close proximity to the rod. Alternating magnetic and non-magnetic generally circumferential strips are positioned axially along the rod. The disposition of the strips preferably resembles the appearance of threads. The passage of the of alternating strips beneath the sensors produces signals indicative of rod position and velocity. The output of the sensors is a pair of pulse trains with pulses corresponding to the passage of individual magnetic strips. The pulse trains are contained in two signals in quadrature providing direction of travel as well as position information in a conventional manner. Each of the two quadrature signals changes state twice when the rod moves from one magnetic strip to the next. Thus, in an arrangement using two sensors, a maximum of four state changes occur in the distance from the center of one magnetic strip, through a non-magnetic strip, to the center of an adjacent magnetic strip. The resolution of such devices is limited by the width of the strips and the number of sensors used. While such controllers are, in general, successful in providing position information to a feedback controller, some applications require more precise position and velocity information than can be conventionally provided by the abovedescribed system.

SUMMARY OF THE INVENTION

The present invention provides position signals having increased resolution without the need to modify the physical portions of the position sensor arrangement. More specifically, the present invention provides electrical means in which multiple state changes are provided in two quadrature signals, such state changes corresponding to discreet locations within the interval from the center of one magnetic strip to the center of the next magnetic strip.

In accordance with the present invention, there is provided a circuit receiving two input position signals in quadrature, combining these two input position signals into a number of sum signals, digitizing the sum signals and combining the digitized signals into new position signals in quadrature having greatly increased resolution.

Further in accordance with the invention, one of the input position signals is inverted and added with the other input position signal and the resulting sum signals are digitized such that additional digitized sum signals are available for combining into increased resolution new position signals.

Yet further in accordance with the invention, the input position signals are combined by applying the input position signals to opposite ends of a number of resistors connected in series and obtaining sum signals at a number of terminals connected to the resistors.

Still further in accordance with the invention, the sum signals are digitized by means of comparator circuits which compare the sum signals to reference signals and have a first output if the sum signal is lower than the reference signal and a second output if the sum signal is higher than the reference signal.

Yet further in accordance with the invention, the digitized sum signals are applied to several debouncer circuits and flip-flops. The output of the flip-flops being a logic 1 or a logic 0 depending upon the output of the individual comparators.

Still further in accordance with the invention, the individual flip-flops are enabled, that is, allowed to change state, only during intervals when adjacent flip-flops have different values.

Still further in accordance with the invention, the outputs from the flip-flops are combined into increased resolution new position signals available on two output lines, said new position signals being in quadrature.

It is the primary object of the present invention to provide position and velocity signals of increased resolution using conventional mechanical components.

It is another object of the present invention to provide a high resolution position signal identical in all respects to prior art quadrature position signals except having a significantly increased resolution.

It is yet another obJect of the present invention to provide a position signal processing circuit accepting analog quadrature position signals and providing as output digitized quadrature position signals of increased resolution.

It is still another object of the present invention to provide a circuit which supplies increased resolution quadrature position signals providing both displacement and direction output in a format identical to conventional quadrature signals.

It is still another object of the present invention to provide an analog to a digital converter which increases resolution of a pulse train type quadrature signal and prevents the introduction of extraneous pulses in the digitizing process.

These and other objects and advantages of the present invention will become apparent from the following description taken together with the drawings explained in the next section.

DESCRIPTION OF THE PREFERRED EMBODIMENT

Figure 1:
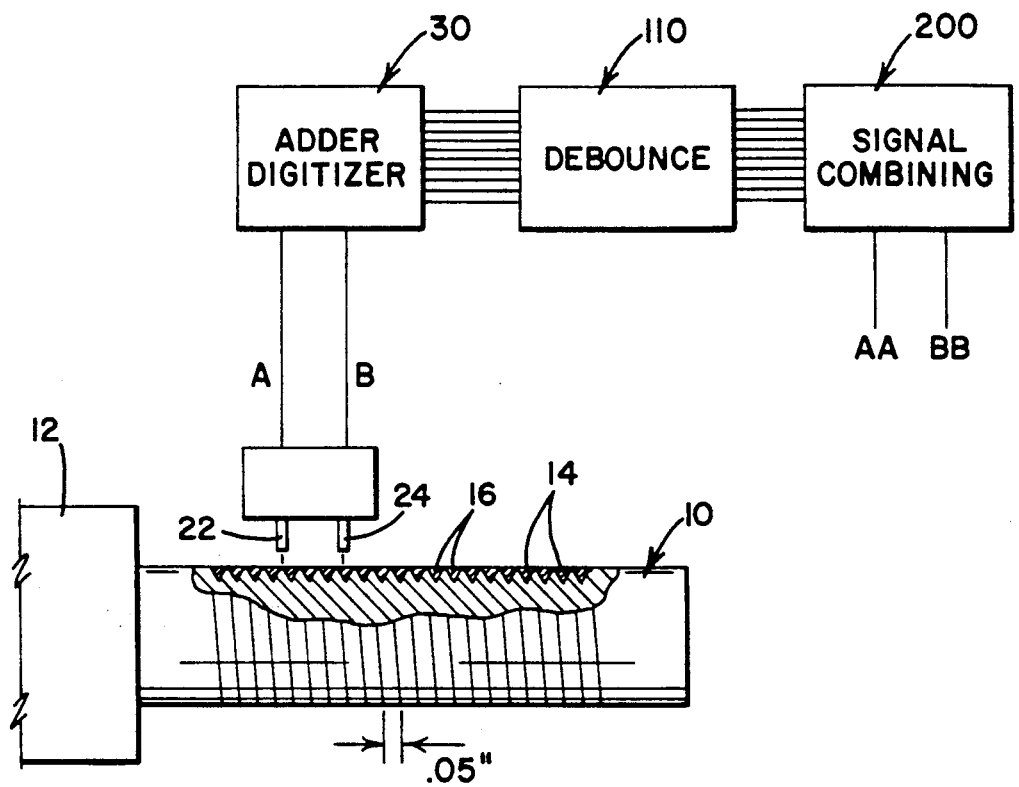
FIG. 1 is a schematic diagram, partly in section, showing a shaft subject to axial movement, sensors for determining the position of the shaft and the signal processing circuitry of the present invention in block diagram form.

Referring now for the drawings wherein the showings are for the purpose of illustrating the preferred embodiment only and not for the purposes of limiting the same, FIG. 1 shows a shaft 10 subject to axial movement surrounded by a stationary collar 12. The shaft 10 is fabricated from magnetic material such as steel. The shaft 10 is threaded over a portion of its length and the grooves 14 of the threads are filled with a non-magnetic material such as aluminum 16. In the preferred embodiment, the threads are 20 pitch. That is, the spacing between adjacent thread ridges is 0.05 inches.

Two magnetic transducers 22, 24 are fixed in place with relation to the stationary collar 12. The transducers 22, 24 are positioned such that their signals are ¼ cycle out of phase. That is, when the first transducer 22 is positioned over the center of an upraised thread, the second transducer is positioned ¼ the distance between the center of an upraised thread and the next center of an upraised thread. This positioning relationship produces electrical signals in quadrature and is conventional in many measuring devices.

Figure 5:
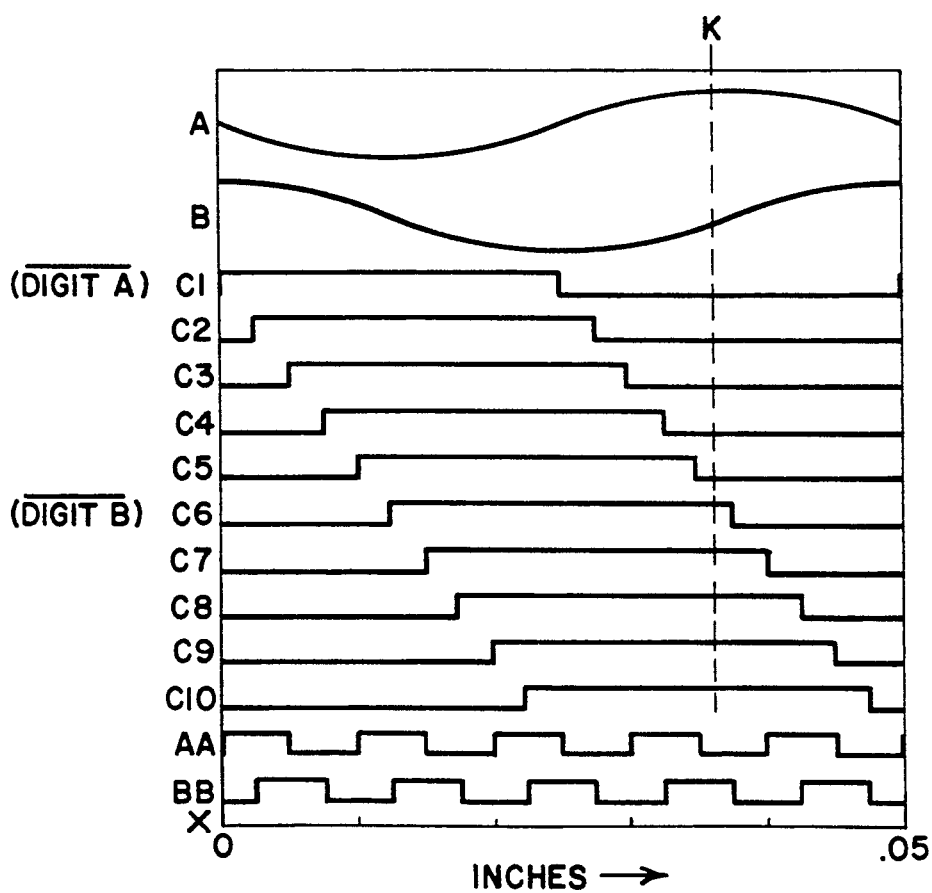

The transducers 22 and 24 are supplied with a five volt signal reference level from a power supply (not shown). The outputs of the transducers 22 and 24 are the input position signals A, B and are dependent upon the position of the shaft 10. The input position signals A, B are approximately sinusoidal and vary through one sinusoidal cycle over each thread length of axial movement of the shaft 10. Representations of the input position signals A, B generated by the two transducers 22, 24 are seen in FIG. 5 labeled A and B respectively. As can be seen, the output of transducer 22 varies from the signal reference level in the form of a single cycle of a sine wave over 0.05 inches of axial shaft movement, that is, one thread length. Input position signal B varies in an identical manner but is 90 degrees out of phase with respect to signal A.

THE ADDER DIGITIZER CIRCUIT

Figure 2:
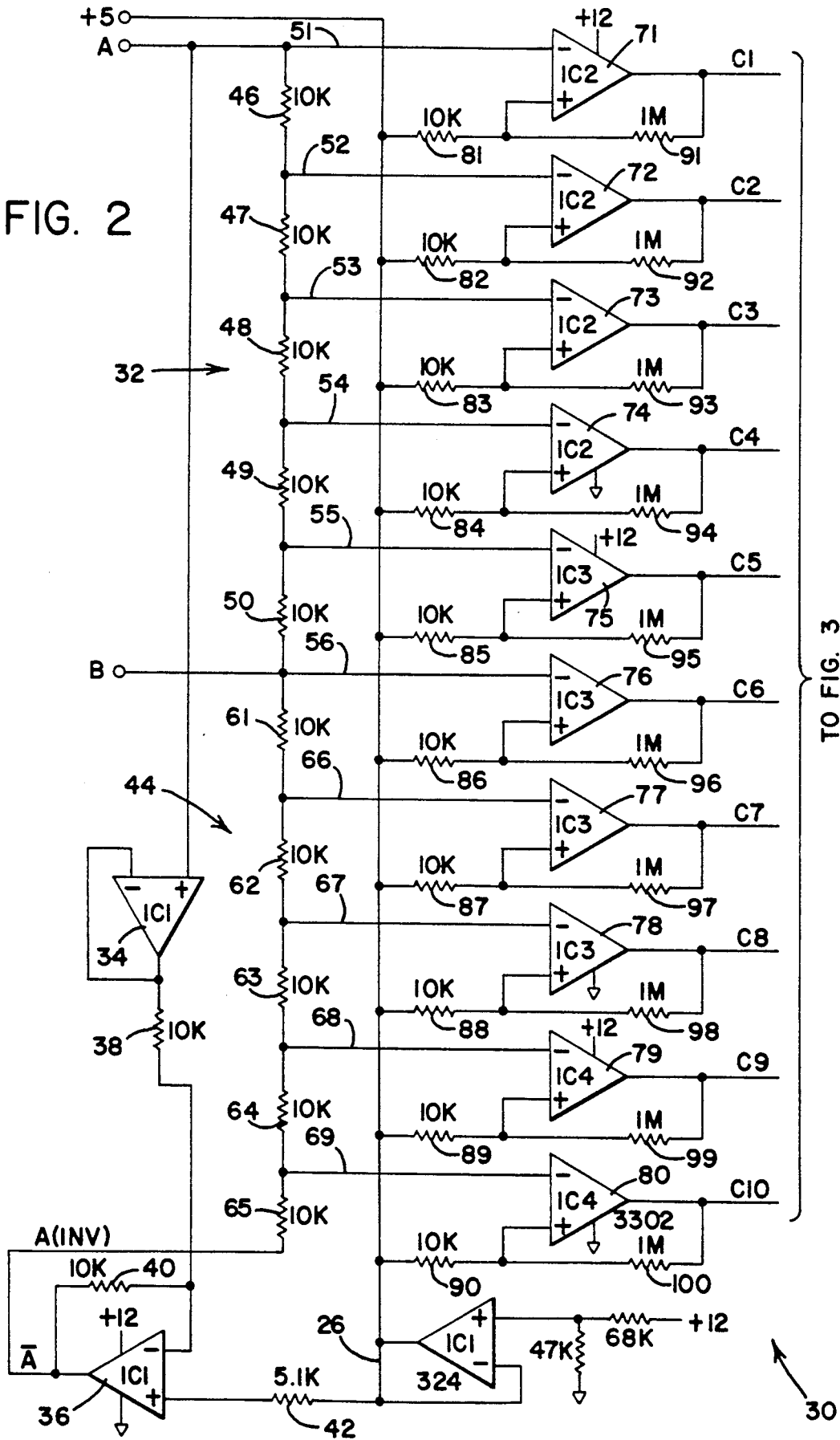
FIG. 2 is a schematic diagram of the adder digitizer circuit shown in block diagram form in FIG. 1.

The input position signals A, B of the transducers 22, 24 are applied to an adder digitizer 30. The adder digitizer is shown in detail in FIG. 2. The circuit elements seen in FIG. 2 are all conventional integrated circuit elements or discrete components available commercially. The input position signal A of the transducer 22 is applied to one end of a first voltage divider-adder 32 and to a buffer 34. The buffer 34 is a conventionally connected unitary gain operational amplifier buffer. The output of the buffer 34 is applied to another operational amplifier conventionally configured as an inverter 36. Resistors 38, 40 and 42 are conventionally selected so that the output of the inverter A (INV) is the value of the input position signal A multiplied by negative 1 with respect to the signal reference level of +5 volts. Resistor 42 connects the inverter 36 to the +5 volt signal reference line 26.

The output of the inverter 36 is connected to a second voltage divider-adder 44.

The first voltage divider adder 32 is comprised of five 2 percent precision 10K resistors 46, 47, 48, 49, 50 which are connected in series between the terminal carrying the input position signal A and the terminal carrying the input position signal B. Output terminals from the first voltage divider adder 32 are provided at both ends of the series of resistors and between each of the resistors. Six outputs are thereby provided. These six outputs 51, 52, 53, 54, 55, 56 are added multiples of the input position signal A from the first transducers 22 and input position signal B from the second transducer 24. The signal on output 51 is simply A. The signal on output 52 is 0.8A plus .2B. The signal on output 53 is 0.4A plus .6B. The signal on output 54 is plus 0.6A plus 0.4B. The signal on output 55 is 0.2A plus 0.8B. The signal on output 56 is B.

In a like manner, the second voltage divider adder 44 is comprised of resistors 61, 62, 63, 64 and 65 which are all 2 percent precision 10K resistors. The resistors are connected in series between the terminal carrying the input position signal B from transducer 24 and the output A (INV) of inverter 36. Outputs are provided at the points intermediate the resistors providing the following signals: at output 66 minus 0.2A plus 0.8B; at output 67 minus 0.4A plus 0.6B; at output 68 minus 0.6A plus 0.4B; and, at output 69 minus 0.8A plus 0.2B.

The individual outputs 51–56 and 66–69 are applied to the inverting inputs of operational amplifiers 71–80. The non-inverting input of each of these operational amplifiers is connected through a 10K resistor 81–90 to the 5 volt reference line 26. One megaohm feedback resistors 91–100 are connected between the output of the operational amplifiers and their non-inverting inputs. The operational amplifiers 71–80, thus, are conventionally configured as snap action comparators. When the value of a given output 51–56, 66–69 exceeds the signal reference value on line 26, the output of the associated operational amplifier 71–80 will go to the negative saturation voltage. The operational amplifier inverts and digitizes the signal. Whenever the signal on any of the outputs 51–56 and 66–69 exceeds the reference voltage on line 26, the digital output from its associated operational amplifier 71–80 will be the negative saturation voltage level, logic 0. Whenever an output on lines 51–56 and 66–69 is less than the reference level on line 26, the output of the associated operational amplifier 71–80 will be the positive saturation voltage level, logic 1.

The output of the operational amplifiers 71–80 are identified as C1–C10 respectively. The relationships of the signals C1–C10 to each other and shaft 10 position are shown in FIG. 5. It can be seen that the signals C1–C10 change state at discrete, repeatable positions dependent upon shaft 10 position only.

Figure 3:
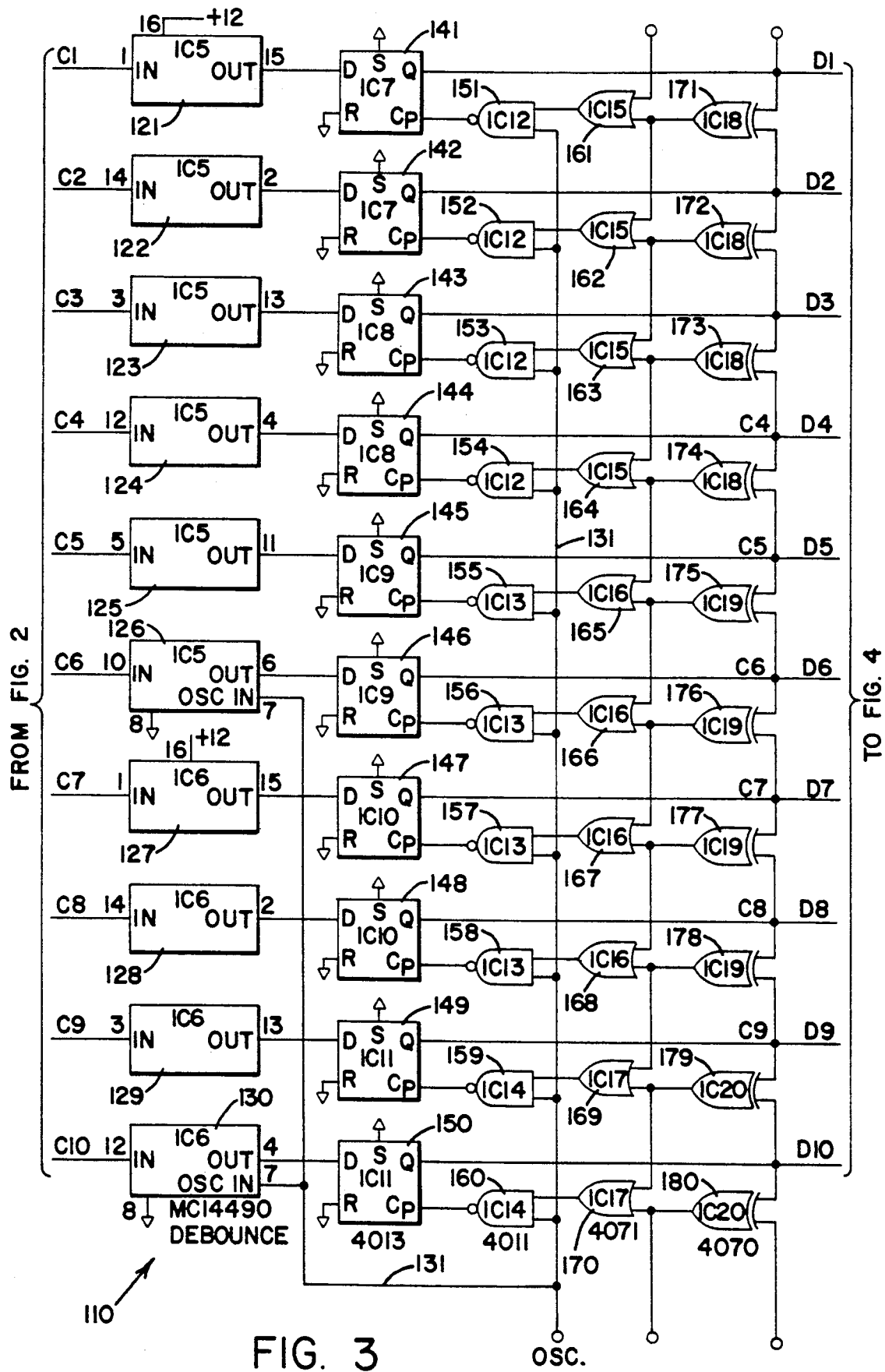
FIG. 3 is a schematic diagram of the debounce circuit shown in block diagram form in FIG. 1.

The output of the adder digitizer 30 are the signals C1–C10 carried on 10 lines to the debounce circuit 110. The debounce circuit 110 is shown in detail in FIG. 3.

THE DEBOUNCE CIRCUIT

The debounce circuit is provided with input signals C1–C10 which are applied to integrated debounce circuits 121–130. Integrated debounce circuits are available from Motorola semiconducters under the part number MCI4490, each integrated package contains six debounce circuits. The output of each debounce circuit is identical to its input except that the transitions between the high and low state are coordinated with a clock signal, delayed four clock pulses and chatter and similar signal degradation is removed.

The debounce circuits 121-130 receive clock signals from an oscillator output line 131. The oscillator output line carries a conventional clock signal generated by a conventional oscillator (not shown) having a frequency greater than the highest frequency of change expected to be seen in the outputs from the operational amplifiers 71-80. The oscillator output need not be especially high as the output from the operational amplifiers 71-80 represent mechanical movement and are, electronically speaking, of low frequency.

The outputs of the debounce circuits 121-130 are essentially identical to the inputs to these circuits identified by the reference C1-C10 seen in FIG. 5. These output signals are applied to ten D-Q flip-flops 141-150. The flip-flops used are conventional CMOS 4013 integrated circuits available from a variety of sources. The flip-flops 141-150 receive clocking signals from associated NAND gates 151-160. The individual NAND gates 151-160 pass the clock signal on the oscillator output line 131 only when the signal on its other input line is high. If the signal on the other input line is low, clock pulses are blocked and a D-Q flip-flop associated with the particular NAND gate is disabled. The disabled flip-flop cannot change its output.

The enable signal applied to the second input of the NAND gates 151-160 are created by OR gates 161-170 and exclusive OR gates 171-180. These gates are interconnected such that clock pulses are supplied only to D-Q flip-flops adjacent to a change in state. Thus, when the shaft 10 is in the position represented by the dotted line K in FIG. 5, signals C1-C5 will be low and signals C6-C10 will be high. With C5 equal to 0 and C6 equal to 1, the output of exclusive OR gate 175 will be equal to 1. C4 and C5 are both equal to 0 at this point and the output of exclusive OR gate 174 will be 0. The output of OR gate 165, dependent upon the output of exclusive OR gates 174 and 175, will be 1. The output of OR gate 165 is the signal which enables NAND gate 155 and clock pulses will therefore be passed through NAND gate 155 to D-Q flip-flop 145. If the signal on the input of the D-Q flip-flop 145 changes, the output Q of that flip-flop will change on the next clock pulse.

This same signal condition exists for flip-flop 146 which is also enabled as adjacent of change state for position K. In contrast, the D-Q flip-flop 148, which is not adjacent of change of state, is not enabled. Thus, as can be seen in FIG. 5, the signal C7, C8 and C9 at the position K are all equal to 1. As C7 and C8 are both 1, the output of exclusive OR 177 is 0. As C8 and C9 are both equal to 1, the output of exclusive OR 178 is also 0. OR gate 168, having two zeros as inputs, has a 0 output. NAND gate 158 therefore has a 1 output regardless of the state of the clock pulse and the D-Q flip-flop 148 is disabled. Even if the input on the D-Q flip-flop changes state, the output will not be altered as clock pulses are not received.

In the operation of the mechanical portions of the position sensor and the adder digitizer portions of the circuit 30, state changes can only take place in signals adjacent an existing state change. State changes elsewhere are the result of noise or other errors. The debounce circuit 110 removes any such errors and presents clean, clock timed state changes as signals D1-D10 at its 10 output lines. The signals D1-D10 are otherwise identical to those received on the 10 input lines C1-C10.

THE SIGNAL COMBINING CIRCUIT

Figure 4:
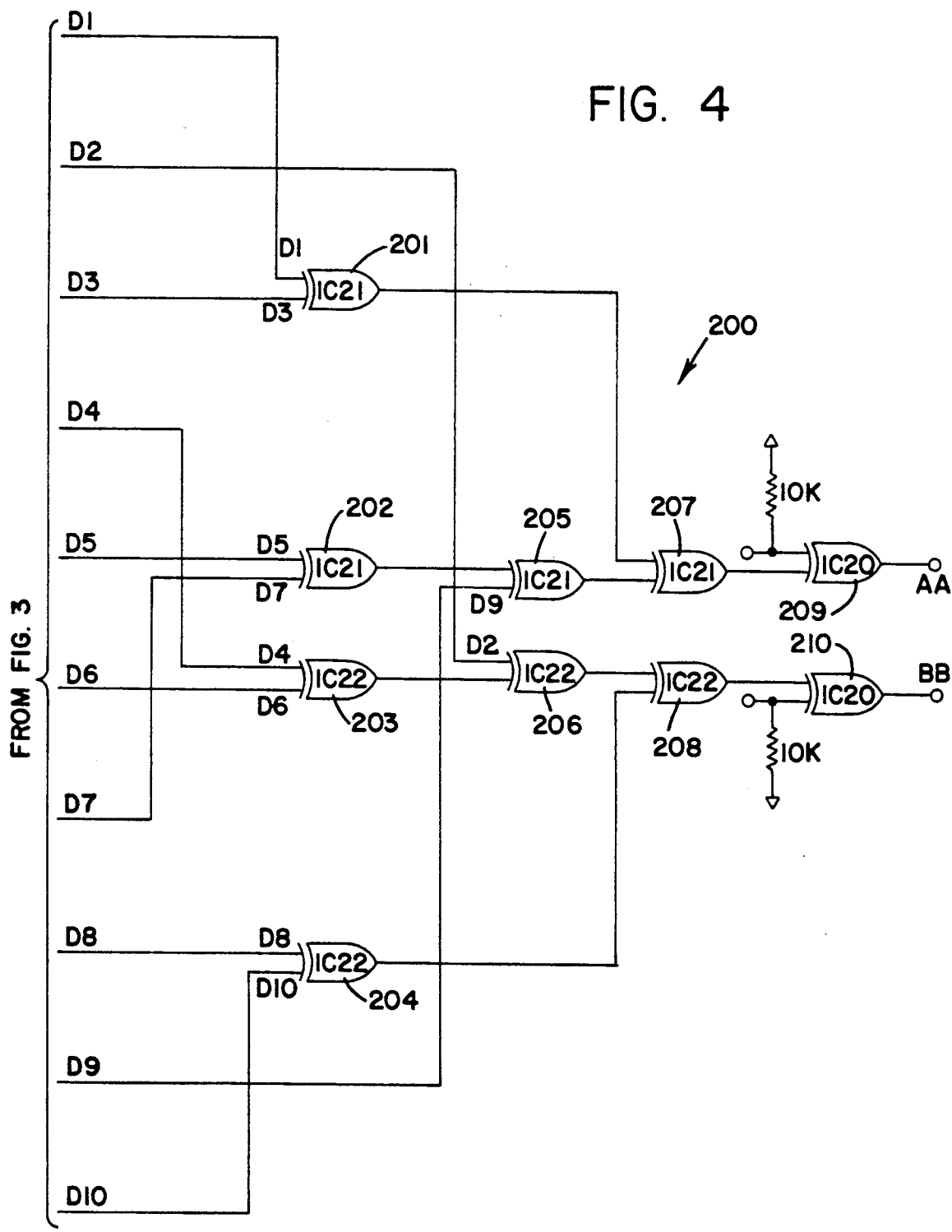
FIG. 4 is a schematic diagram of the signal combining circuit shown in block diagram form in FIG. 1; and, FIG. 5 is a signal chart illustrating the relationship and state changes of various signals in the circuit.

The output signals D1-D10 of the debounce circuit 110 are applied to a signal combining circuit 200 shown in detail in FIG. 4. Signals D1-D10 are combined in a group of exclusive OR circuits 201-210 to produce ultimate output signals AA, BB shown in FIG. 5. Signals D1 and D3 are applied to the inputs of exclusive OR 201. The output of exclusive OR 201 will change state whenever either signal D1 or D3 changes state. Signals D5 and D7 are applied to exclusive OR 202, signals D4 and D6 are applied to exclusive OR 203 and signals D8 and D10 are applied to exclusive OR circuit 204 in the same manner. The output of exclusive OR 202 and signal D9 are applied to exclusive OR 205 and the output of exclusive OR 205 and the output of exclusive OR 201 are applied to exclusive OR 207. The output of exclusive OR 207 is inverted in exclusive OR 209 to produce new position signal AA. New position signal AA changes state whenever one of the odd signals D1, D3, D5, D7, D9 changes state. The even signals D2, D4, D6, D8, D10 are combined in exclusive OR gates 203, 204, 206, 208, 210 in a manner identical to the odd signals to provide the new position signal BB. Signal BB changes state whenever one of D2, D4, D6, D8 or D10 changes state. As can be seen in FIG. 5, the new position signals AA, BB are digital signals in phase quadrature. They are identical in all respects to a conventionally generated digital quadrature signal as would be generated by transducers 22, 24 except the resolution is increased by five tires. Thus, conventional digital quadrature signals would be inverted versions of signals C1 and C6 in FIG. 5. These signals are 90 degrees out of phase and complete one cycle in the interval depicted, 0.05 inches of travel. As four transitions take place, maximum resolution is 0.0125 inches for the shaft, transducer combination described. With the addition of the circuit described herein twenty transitions are presented in two quadrature signals. A five fold increase in resolution is provided electronically from signals created by conventional sensors.

The invention has been described with reference to a preferred embodiment. Obviously, modifications and alterations will occur to others upon the reading and understanding of this specification. It is intended to include all such modifications and alterations insofar as they come within the scope of the appealed claims or the equivalents thereof.

Having thus described the invention, it is claimed:

1. An object position signal creation apparatus for use with an object having a surface having regularly alternating strips of material disposed over a portion of said object comprising:
   at least one transducer pair positioned proximate said surface, said transducer pair producing a pair of input position signals in quadrature varying cyclically, with one cycle of said signals corresponding to one strip alternation width indicative of the position of said object, said input position signals being placed on a first input position signal line and a second input position signal line;
   an adder means connected between said first and second input position signal lines and comprising a plurality of terminals, each terminal carrying an adder output signal;
   reference signal means producing a reference signal on a reference signal line;

a plurality of comparator means receiving said adder output signals and said reference signal, comparing each of said adder output signals to said reference signal and having a digital output indicative of the results of each said comparison whereby a plurality of digital comparison signals having two states are created, the change of state of each such digital comparison signal corresponding to a discrete object position wherein movement of said object causes singly ordered successive digital comparison signal state changes between logically adjacent digital comparison signals;

debounce circuit means for receiving said plurality of digital comparison signals and for masking all digital comparison signal state changes between digital comparison signals not logically adjacent, to generate a plurality of debounce digital comparison signals; and, output logic means combining said plurality of debounce digital comparison signals into new digital position signals.

2. The apparatus of claim 1 wherein said adder means comprises a plurality of series connected resistors.

3. The apparatus of claim 2 further comprising an inverter means receiving said first input position signal as input and creating a first inverted input position signal on a first inverted signal line; and, a second adder means comprising a plurality of series connected resistors, connected between said second input position signal line and said first inverted input position signal line and terminals carrying adder output signals.

4. The apparatus of claim 1 wherein said new digital position signals are comprised of a first new digital position signal and a second new digital position signal in quadrature to said first new digital position signal.

5. The apparatus of a claim 1 wherein said comparator means are operational amplifier comparators.

6. An object position signal creation apparatus for use with an object having a surface having regularly alternating strips of material disposed over a portion of said object comprising:

at least one transducer pair positioned proximate said surface, said transducer pair producing a pair of input position signals in quadrature varying cyclically, with one cycle of said signals corresponding to one strip alternation width indicative of the position of said object, said input position signals being placed on a first input position signal line and a second input position signal line;

an adder means connected between said first and second input position signal lines and comprising a plurality of terminals, each terminal carrying an adder output signal;

reference signal means producing a reference signal on a reference signal line;

a plurality of comparator means receiving said adder output signals and said reference signal, comparing each of said adder output signals to said reference signal and having a digital output indicative of the results of each said comparison whereby a plurality of digital comparison signals having two states are created, the change of state of each such digital comparison signal corresponding to a discrete object position;

debounce means receiving said digital comparison signals and generating flip-flop output signals, said debounce means comprising:

means generating clock pulses; a plurality of clocked flip-flops having a clock input, one of said flip-flops receiving each of said digital comparison signals, each said flip-flop being enabled to change output state only on receipt of a clock signal and each said flip-flop being arranged logically adjacent at least two other clocked flip-flops; and, debounce logic means passing clock pulses to selected ones of said flip-flops such that only those flip-flops logically adjacent to a flip-flop having an output state different from its own are enabled; and, output logic means combining said flip-flop output signals into new digital position signals.

7. An object position signal creation apparatus for use with an object having a surface with regularly alternating strips of material disposed over a portion of said object comprising:

at least one transducer pair positioned proximate said surface, said transducer pair producing a pair of input position signals in quadrature varying cyclically, with one cycle of said signals corresponding to one strip alternation width indicative of the position of said object, said input position signals being placed on a first input position signal line and a second input position signal line;

inverter means receiving said first input position signal as input and creating a first inverted input position signal on a first inverted signal line;

first adder means connected between said first and second input position signal lines and comprising a first plurality of series connected resistors and a plurality of first terminals, each first terminal carrying a first adder output signal;

second adder means comprising a second plurality of series connected resistors connected between said second input position signal line and said first inverted input position signal line and second terminals carrying second adder output signals;

reference signal means producing a reference signal on a reference signal line;

a plurality of comparator means receiving said first and second adder output signals and said reference signal, comparing each of said adder output signals to said reference signal and having a digital output indicative of the results of each said comparison whereby a plurality of digital comparison signals having two states are created, the change of state of each such digital comparison signal corresponding to a discrete position, wherein each said digital comparison signal changes state at a discrete object position in each strip alteration width, said digital comparison signals changing states at adjacent object positions being logically adjacent;

output logic means combining said digital comparison signals into new digital position signals; and, debounce means comprising:

means generating clock pulses;

a flip-flop having a clock input and an output associated with each said digital comparison signal, said flip-flops being logically adjacent one another when said flip-flop associated digital comparison signals are logically adjacent one another;

a plurality of exclusive or logic means having outputs, one of said exclusive or logic means receiving inputs consisting of the outputs of each pair of adjacent flip-flops, pairs of said exclusive or logic means being adjacent when said pair both receive as input the output of a given single flip-flop;

a plurality of or logic means having outputs, one of said or logic means receiving inputs consisting of the outputs of each pair of adjacent exclusive or logic means; and, a plurality of nand logic means having outputs and receiving said clock pulses on one input line, one of said nand logic means receiving the output of each said or logic means on a second input, the output of each such nand logic means being applied to the clock input of one of said flip-flops.

8. The apparatus of claim 7 wherein said output logic means comprises an odd logic array and an even logic array, said odd logic array receiving a first group of flip-flop outputs not logically adjacent one other and having as output a first new digital position signal, said even logic array receiving a second group of flip-flop outputs not logically adjacent one another and having an output a second new digital position signal, said second new digital position signal being in quadrature to said first new digital position signal.

9. An object position signal creation apparatus for use with an object having a surface having regularly alternating strips of material disposed over a portion of said object comprising:

at least one transducer pair positioned proximate said surface, said transducer pair producing a pair of input position signals in quadrature varying cyclically, with one cycle of said signals corresponding to one strip alternation width indicative of the position of said object, said input position signals being placed on a first input position signal line and a second input position signal line;

an adder means connected between said first and second input position signal lines and comprising a plurality of terminals, each terminal carrying an adder output signal;

reference signal means producing a reference signal on a reference signal line;

a plurality of comparator means receiving said adder output signals and said reference signal, comparing each of said adder output signals to said reference signal and having a digital output indicative of the results of each said comparison whereby a plurality of digital comparison signals having two states are created, the change of state of each such digital comparison signal corresponding to a discrete object position and a pattern of the changes of state of the digital comparison signals as the object moves defining a logical adjacency between said digital comparison signals which successively change state;

output logic means combining said flip-flop output signals into new digital position signals, said output logic means comprising: an odd logic array and an even logic array, said odd logic array receiving a first group of digital comparison signals not logically adjacent one other and having as output a first new digital position signal, said even logic array receiving a second group of digital comparison signals not logically adjacent one other and having as output a second new digital position signal, said second new digital position signal being in quadrature to said first new digital position signal.

10. A circuit for increasing the resolution of a position indicating transducer having a quadrature output comprising a first position indicating signal on a first position indicating signal line and a second position indicating signal on a second position indicating signal line, said circuit comprising adder means combining said first position indicating signal and said second position indicating signal and creating a plurality of analog signals representative of combined multiples of said first position indicating circuit and said second position indicating circuit;

digitizer means creating a plurality of digital signals representative of said analog signals, said digital signals singly undergoing ordered cyclic state transitions;

debounce circuit means accepting said digital signals and creating debounce output signals replicating said singly ordered cyclic state transitions of said digital signals accepted and not replicating other state transitions of said digital signals; and, logic means accepting said debounce output signals and creating a first new digital quadrature output signal and a second new digital quadrature signal.

11. The circuit of claim 10 wherein said adder means is a voltage divider comprising a plurality of resistors connected in series between said first position indicating signal line and said second position indicating signal line and a plurality of terminals carrying said analog signals; said digitizer means comprises a plurality of comparators each accepting one of said analog signals, comparing it to a known reference and creating one of said digital signals.

12. A circuit for increasing the resolution of a position indicating transducer having a quadrature output comprising a first position indicating signal on a first position indicating signal line and a second position indicating signal on a second position indicating signal line, said circuit comprising:

adder means combining said first position indicating signal and said second position indicating signal and creating a plurality of analog signals representative of combined multiples of said first position indicating circuit and said second position indicating circuit, said adder means comprising a voltage divider having a plurality of resistors connected in series between said first position indicating signal line and said second position indicating signal line and a plurality of terminals carrying said analog signals;

digitizer means creating a plurality of digital signals representative of said analog signals, said digital signals singly changing logic states in a logical progression as the position indicating transducer generates the quadrature output, said digitizer means comprising a plurality of comparators each accepting one of said analog signals, comparing it to a known reference and creating one of said digital signals;

logic means accepting said digital signals and creating a first new digital quadrature output signal and a second new digital quadrature signal, said logic means comprising an odd logic array receiving as inputs a first group of said digital signals and having as output said first new digital quadrature output signal; and, an even logic array receiving as inputs a second group of said digital signals and having as output said second new digital quadrature output signal, said logic means functioning to alternately output said first new digital quadrature output signal using said odd logic array, then output said second new digital quadrature output signal using said even logic array.

13. A debounce circuit for use with an object position signal creation apparatus which senses alternating magnetic properties of the object and generates a plurality of ordered raw digital comparison signals which dynamically singly sequence between logic states corresponding to motion of the object, the sequence defining logical adjacency between pairs of the plurality of ordered raw digital comparison signals, said circuit comprising:

a set of a first number of digital input terminals and a set of the first number of digital output terminals, each digital input terminal corresponding to a single ordered raw digital comparison signal;

clock signal generating means for generating a clock signal;

synchronizing means for synchronizing output of a plurality of ordered synchronized digital position signals with the clock signal, the synchronizing means receiving the plurality of ordered raw digital comparison signals from the set of digital input terminals and, at intervals defined by the clock signal, outputting the plurality of ordered synchronized digital position signals;

a plurality of sensing means for sensing the logic level of the set of digital output terminals, each single sensing means sensing a pair of logically adjacent debounce circuit output signals present at the digital output terminals and each single sensing means generating a feedback signal having a high logic level when the pair of logically adjacent debounce circuit output signals sensed are at different logic levels; and, a plurality of gating means corresponding to the plurality of sensing means and responsive to the clock signal and the plurality of feedback signals, each for transferring an ordered synchronized digital position signal to one of the digital output terminals when the clock signal and corresponding feedback signal is at the high logic level and for restricting transfer of an ordered synchronized digital position signal to one of the digital output terminals when the corresponding feedback signal is at a low logic level, forming the debounce circuit output signals.

* * * * *

UNITED STATES PATENT AND TRADEMARK OFFICE
CERTIFICATE OF CORRECTION

PATENT NO. : 5,012,239

DATED : April 30, 1991

INVENTOR(S) : Elmer L. Griebeler

It is certified that error appears in the above-identified patent and that said Letters Patent is hereby corrected as shown below:

ON TITLE PAGE:

Assignee: Visi-Trak Corporation, Cleveland, Ohio

Signed and Sealed this

First Day of September, 1992

Attest:

DOUGLAS B. COMER

*Attesting Officer*     *Acting Commissioner of Patents and Trademarks*